(12) United States Patent
Sugiyama et al.

(10) Patent No.: US 9,245,712 B2
(45) Date of Patent: Jan. 26, 2016

(54) FOCUSED ION BEAM SYSTEM

(71) Applicant: HITACHI HIGH-TECH SCIENCE CORPORATION, Minato-ku, Tokyo (JP)

(72) Inventors: Yasuhiko Sugiyama, Tokyo (JP); Tomokazu Kozakai, Tokyo (JP); Osamu Matsuda, Tokyo (JP)

(73) Assignee: HITACHI HIGH-TECH SCIENCE CORPORATION (JP)

(*) Notice: Subject to any disclaimer, the term of this patent is extended or adjusted under 35 U.S.C. 154(b) by 117 days.

(21) Appl. No.: 14/221,514

(22) Filed: Mar. 21, 2014

(65) Prior Publication Data
US 2014/0284474 A1 Sep. 25, 2014

(30) Foreign Application Priority Data
Mar. 25, 2013 (JP) ................................. 2013-061637

(51) Int. Cl.
*H01J 37/28* (2006.01)
*H01J 37/22* (2006.01)
*H01J 37/08* (2006.01)

(52) U.S. Cl.
CPC .............. *H01J 37/28* (2013.01); *H01J 37/222* (2013.01); *H01J 37/08* (2013.01); *H01J 2237/0807* (2013.01); *H01J 2237/221* (2013.01); *H01J 2237/2803* (2013.01); *H01J 2237/31749* (2013.01)

(58) Field of Classification Search
None
See application file for complete search history.

(56) References Cited

U.S. PATENT DOCUMENTS

| | | | |
|---|---|---|---|
| 51,900 A1 | 3/2007 | Ward | 250/423 |
| 8,110,814 B2 * | 2/2012 | Ward | H01J 27/26 250/423 F |
| 2007/0025907 A1 | 2/2007 | Rezeq et al. | 423/447.3 |

FOREIGN PATENT DOCUMENTS

JP 2012 98293 5/2012

* cited by examiner

*Primary Examiner* — Jack Berman
(74) *Attorney, Agent, or Firm* — Adams & Wilks

(57) ABSTRACT

A focused ion beam system includes a gas field ion source which generates gas ions, an ion gun unit which accelerates the gas ions and radiates the gas ions as an ion beam, a beam optical system which includes at least a focusing lens electrode and radiates the ion beam onto a sample, and an image acquiring mechanism which acquires an FIM image of a tip of an emitter based on the ion beam. The image acquiring mechanism includes an alignment electrode which is disposed between the ion gun unit and the focusing lens electrode and adjusts a radiation direction of the ion beam, an alignment control unit which applies an alignment voltage to the alignment electrode, and an image processing unit which combines a plurality of FIM images acquired when applying different alignment voltages to generate one composite FIM image.

5 Claims, 11 Drawing Sheets

FOCUSED ION BEAM SYSTEM

CROSS-REFERENCE TO RELATED APPLICATION

This application claims priority from Japanese Patent Application No. 2013-061637, filed on Mar. 25, 2013, the entire subject matter of which is incorporated herein by reference.

TECHNICAL FIELD

The present invention relates to a focused ion beam system including a gas field ion source.

BACKGROUND

There has been known a focused ion beam system as a system for performing observation, various evaluation or analysis, or the like on a sample such as a semiconductor device, and for preparing a TEM sample by taking a fine and thin sample fragment from a sample and fixing the thin sample fragment to a sample holder.

This focused ion beam system includes an ion source for generating ions and accelerates the ions generated in the ion source to generate an ion beam, and focuses the ion beam to radiate the ion beam as a focused ion beam (FIB).

There are many types of ion sources. In many cases, a focused ion beam system having been put to practical use includes a liquid-metal ion source (particularly, liquid-gallium ion source). However, a transmittance of a sample such as a photomask may be reduced due to injection of gallium, and therefore, countermeasures such as low acceleration have been employed. Incidentally, there is a need for performing observation on a sample having a nanometer size with low damages, and thus it is required to further reduce a diameter of the beam.

Accordingly, in recent years, there has been employed a gas field ion source (GFIS) as a non-contaminating ion source. The gas field ion source uses noble gases as ion species and is capable of generating ion beams having a smaller diameter and higher luminance as compared to liquid-metal ion sources. It has been confirmed that the gas field ion source has certain effects against the above-described problem.

A gas field ion source includes an aciculate emitter with a tip which is sharpened at an atomic level. This emitter is an important member for ionizing a gas, and thus the surface structure of the emitter is important. In order to achieve a high-luminance ion source, it is necessary to make the tip of the emitter as sharp as possible and arrange the shape of the tip such that an ionization area is formed by several atoms. Accordingly, it is possible to locally ionize a gas into gas ions, and thus it is possible to generate an ion beam having a small beam diameter.

There have been known some methods of sharpening a tip of an emitter. As one of those methods, there has been known a field-assisted gas etching method of locally etching a tip of an emitter while supplying oxygen or nitrogen to the vicinity of the emitter (see, for example, US2007/0025907A).

According to this method, it is possible to acquire an emission pattern image (i.e. field ion microscope (FIM) image) of the tip of the emitter and grasp the progress status of etching while observing the FIM (FIM observation), and thus it becomes easy to perform sharpening, so that this method is regarded as a promising method.

In order to acquire an FIM image, a device including a micro-channel plate (MCP) which has a fluorescent surface at a back side and is disposed on a light path of an ion beam is generally used. This device can be incorporated in a beam lens barrel, and can amplify a received ion beam (or focused ion beam) by the MCP and make the amplified beam enter the fluorescent surface, thereby projecting an FIM image onto the fluorescent surface. Accordingly, FIM observation on the tip of the emitter is performed.

In addition to the above-described MCP method, there has been known a method of performing FIM observation on a tip of an emitter by a scanning-FIM (see, for example, JP-A-2012-98293).

According to this method, an axis alignment deflector is used to perform raster scanning on a diaphragm surface, thereby capable of acquiring a field emission pattern image of a tip of an emitter. Accordingly, FIM observation on the tip of the emitter is performed.

Incidentally, when performing field-assisted gas etching, in order to accurately grasp the progress status of etching on a tip of an emitter, it is necessary to confirm the tip of the emitter over a wide visual field. Specifically, the emitter after electric field polishing needs to be confirmed at a visible field of about several tens of atoms or more.

Further, when incorporating the device including the MCP in a focused ion beam system, it is desired to dispose a condenser lens (a focusing lens electrode) 101 close to an emitter 100 which is an ion source, and then dispose an MCP 102 immediately below the condenser lens 101, as shown in FIG. 12. This is because it is necessary to reduce a distance between the emitter 100 and the condenser lens 101 for securing the performance of the focused ion beam system.

However, if the emitter 100 and the condenser lens 101 are disposed close to each other, since a structure such as the condenser lens 101 is disposed immediately above MCP 102, the peripheral component (oblique portions shown in FIG. 12) of an ion beam 103 may be blocked by the structure, so that the amount of ion beam 103 incident on the MCP 102 would be reduced. Therefore, the visual field would narrow, and it would be difficult to confirm the tip of the emitter 100 over a wide range.

Additionally, if the MCP 102 is used to observe an FIM image for a long time, the multiplication factor of the MCP 102 or the fluorescent surface may be deteriorated, so that the FIM image may become darker. Therefore, it may become difficult to clearly observe the tip of the emitter 100, and it may become difficult to accurately perform FIM observation.

Meanwhile, according to the method using the scanning-FIM disclosed in JP-A-2012-98293, since no MCP is used, even if an FIM image is observed for a long time, the FIM image does not become dark. However, even in the scanning-FIM, similarly, a visual field may be restricted by a structure such as a condenser lens.

SUMMARY

The present invention has been made in view of the above-described circumstances, and an object of the present invention is to provide a focused ion beam system capable of acquiring an FIM image of a tip of an emitter over a wide range and performing FIM observation in a wide visual field.

According to an illustrative embodiment of the present invention, there is provided a focused ion beam system including: a gas field ion source which includes an emitter with a sharp tip, and which is configured to ionize a gas at the tip of the emitter to generate gas ions; an ion gun unit which is configured to accelerate the gas ions and radiate the gas ions as an ion beam while extracting the gas ions toward a sample; a beam optical system which includes at least a focusing lens electrode, and is configured to radiate the ion beam onto the sample while focusing the ion beam; and an image acquiring mechanism which is configured to acquire an FIM image of the tip of the emitter based on the ion beam. The image acquiring mechanism includes: an alignment electrode which is disposed between the ion gun unit and the focusing lens electrode, and is configured to adjust a radiation direction of the ion beam; an alignment control unit which is configured to apply an alignment voltage to the alignment electrode; a storage unit which is configured to store the acquired FIM image; and an image processing unit which is configured to perform image processing to combine a plurality of FIM images to generate one composite FIM image, wherein the plurality of FIM images are acquired when applying different alignment voltages and are stored in the storage unit.

According to the above focused ion beam system, when radiating the ion beam onto the sample, the gas field ion source is operated to ionize the gas supplied to the vicinity of the emitter at the tip of the emitter by an electric field to generate gas ions. The ion gun unit accelerates the gas ions and radiates the gas ions as an ion beam while extracting the gas ions toward the sample. This ion beam is radiated onto the sample in a state where the ion beam is focused by the beam optical system (in a focused ion beam state). Therefore, it is possible to perform, for example, observation, processing, or the like on the sample.

Here, when observing the tip of the emitter, FIM images of the tip of the emitter are acquired by the image acquiring mechanism. In this case, the FIM images are acquired while the alignment voltage is changed by the alignment control unit. If the alignment voltage is applied to the alignment electrode, it is possible to deflect the irradiated ion beam according to the voltage value of the alignment voltage, and thus it is possible to change the radiation direction of the ion beam. Therefore, although a portion of a peripheral component or the like of the ion beam is blocked by the focusing lens electrode when the ion beam passes through the focusing lens electrode, it is possible to pass the blocked portion of the ion beam by changing the alignment voltage. Therefore, before and after the alignment voltage is changed, it is possible to acquire FIM images M of different visual fields.

As described above, the image acquiring mechanism acquires a plurality of FIM images of different visual fields by changing the alignment voltage, and stores the FIM images in the storage unit. Then, the image processing unit performs image processing to combine the plurality of acquired FIM images to generate one composite FIM image. Therefore, it is possible to acquire the FIM image of the tip of the emitter over a wide range without being influenced by a structure such as the focusing lens electrode.

Especially, since a bright point corresponding to a protruding portion of the tip of the emitter appears in each FIM image, it is possible to perform FIM observation on the crystal structure of the tip of the emitter over a wide range by the composite FIM image. Therefore, it is possible to accurately grasp whether the crystal structure of the tip of the emitter is in an ideal state (for example, a state where the tip of the emitter has a pyramid-shaped atomic array and the tip edge is configured by one or more atoms).

Therefore, it is possible to accurately grasp the progress situation of etching, for example, when etching the tip of the emitter by field-assisted gas etching, and it is easy to surely finish the tip of the emitter in a desired sharp state.

In the above focused ion beam system, the image processing unit may be configured to combine the plurality of FIM images based on patterns of bright points appearing in the FIM images.

According to this configuration, the image processing unit combines the FIM images based on the patterns of bright points appearing respectively in the FIM images M. For example, the image acquiring unit combines the FIM images M such that the pattern of common bright points of a plurality of bright points appearing in a first FIM image and in a second FIM image overlap with each other. Therefore, it is possible to combine the FIM images while performing matching and obtain an accurate composite FIM image. Especially, since the bright points appearing in the FIM images are used, it is unnecessary to separately prepare marks or others for combining, and it is possible to simply and accurately perform image processing operation.

The above focused ion beam system may comprise: a micro-channel plate which is disposed between the focusing lens electrode and the sample, and which is configured to be movable between a position located on a light path of the ion beam and a position deviated from the light path, and to receive the ion beam having passed through the focusing lens electrode to project the FIM image onto a fluorescent screen, wherein the image acquiring mechanism may be configured to acquire the FIM image projected on the fluorescent screen.

According to this configuration, when observing the tip of the emitter, the micro-channel plate is moved onto the light path of the ion beam, such that the ion beam having passed through the focusing lens electrode enters the micro-channel plate. Therefore, it is possible to project the FIM image of the tip of the emitter onto the fluorescent screen and acquire the FIM image. Further, if the alignment voltage is changed, it becomes possible to pass a portion of the ion beam, which is blocked by the focusing lens electrode at a stage before the changing. Therefore, it is possible to acquire a plurality of FIM images of different visual fields.

Therefore, although the focusing lens electrode is disposed close to the emitter in order to secure performance of the focused ion beam system, whereby the focusing lens electrode is disposed immediately above the micro-channel plate, it is possible to perform FIM observation on the tip of the emitter over a wide range based on the composite FIM image without being influenced by the focusing lens electrode.

In the above focused ion beam system, the image acquiring mechanism may be configured to acquire the FIM image in a state where applying of a voltage to the focusing lens electrode is stopped.

According to this configuration, since it is possible to pass the ion beam without being focused (refracted) by the focusing lens electrode, it is possible to make the ion beam enter the micro-channel plate over a wider area. Therefore, it is possible to acquire an accurate FIM image which is clearer and is not influenced by refraction, and it is easy to perform more accurate FIM observation.

The above focused ion beam system may further comprise: a deflector which is disposed between the focusing lens electrode and the sample, and which is configured to correct the radiation direction of the ion beam having passed through the focusing lens electrode, and to perform scanning with the corrected ion beam in a direction parallel to a surface of the sample; and a deflection control unit which is configured to apply a correction signal to the deflector such that the deflector performs the correction, and to apply a scan signal to the deflector such that the deflector performs the scanning. The deflector may be configured to perform the correction such that the radiation direction of the ion beam having passed through the focusing lens electrode becomes parallel to an axial line of the emitter, and the image acquiring mechanism may be configured to acquire an FIM image based on the scan signal and a detection signal of secondary charged particles generated from the sample at incidence of the ion beam, or based on the scan signal and a detection signal of a beam current of the ion beam incident on the sample.

According to this configuration, when performing FIM observation on the emitter, the ion beam whose radiation direction is changed by the alignment electrode is focused and becomes a state where the radiation direction is inclined with respect to the axial line of the emitter by refraction effect while passing through the focusing lens electrode, and then enters the deflector. In this case, the deflector corrects the inclination of the ion beam by the correction signal applied from the deflection control unit, thereby re-adjusting the radiation direction such that the radiation direction becomes parallel to the axial line of the emitter. Therefore, it becomes possible to make the ion beam (focused ion beam) focused on the surface of the sample perpendicularly incident on the sample. In addition, the deflector performs scanning with the ion beam, which is incident perpendicularly on the surface of the sample, in a direction parallel to the surface of the sample by the scan signal applied from the deflection control unit.

The image acquiring mechanism can acquire field emission pattern images based on the scan signal and the detection signal (variation of the intensity) of the secondary charged particles generated from the sample at incidence of the ion beam, or based on the scan signal and the detection signal (current variation) of the beam current of the ion beam incident on the sample, thereby acquiring the FIM image. Specifically, it is possible to configure the FIM images by synchronizing the detection signal and the scan signal, thereby capable of acquiring the FIM image. Further, it is possible to acquire a plurality of FIM images of different visual fields by performing the above-described FIM image acquisition in a similar manner while changing the alignment voltage.

Especially, the deflector performs the scanning in a direction parallel to the surface of the sample in a state where the radiation direction of the ion beam is re-adjusted to a direction perpendicular to the surface of the sample. Therefore, for example, even in a case where an orifice having a small-diameter opening provided for preventing a gas introduced to the vicinity of the sample from being mixed with the gas field ion source side, it is possible to pass the ion beam through the orifice with the scanning.

Therefore, even in this case where an orifice or the like is provided, it is possible to surely perform FIM observation on the tip of the emitter over a wide range.

According to the above configuration, it is possible to acquire an FIM image of a tip of an emitter over a wide range, and perform FIM observation in a wide visual field. Therefore, it is possible to accurately grasp the progress status of etching, for example, when etching the tip of the emitter by field-assisted gas etching, and it is easy to surely finish the tip of the emitter in a desired sharp state.

BRIEF DESCRIPTION OF THE DRAWINGS

The above and other aspects of the present invention will become more apparent and more readily appreciated from the following description of illustrative embodiments of the present invention taken in conjunction with the attached drawings, in which.

DETAILED DESCRIPTION

First Illustrative Embodiment

Hereinafter, a first illustrative embodiment of the present invention will be described with reference to the accompanying drawings. The first illustrative embodiment will be described using an example of employing an MCP to acquire an FIM image (field ion image) of a tip of an emitter.

(Configuration of Focused Ion Beam System)

Figure 1:
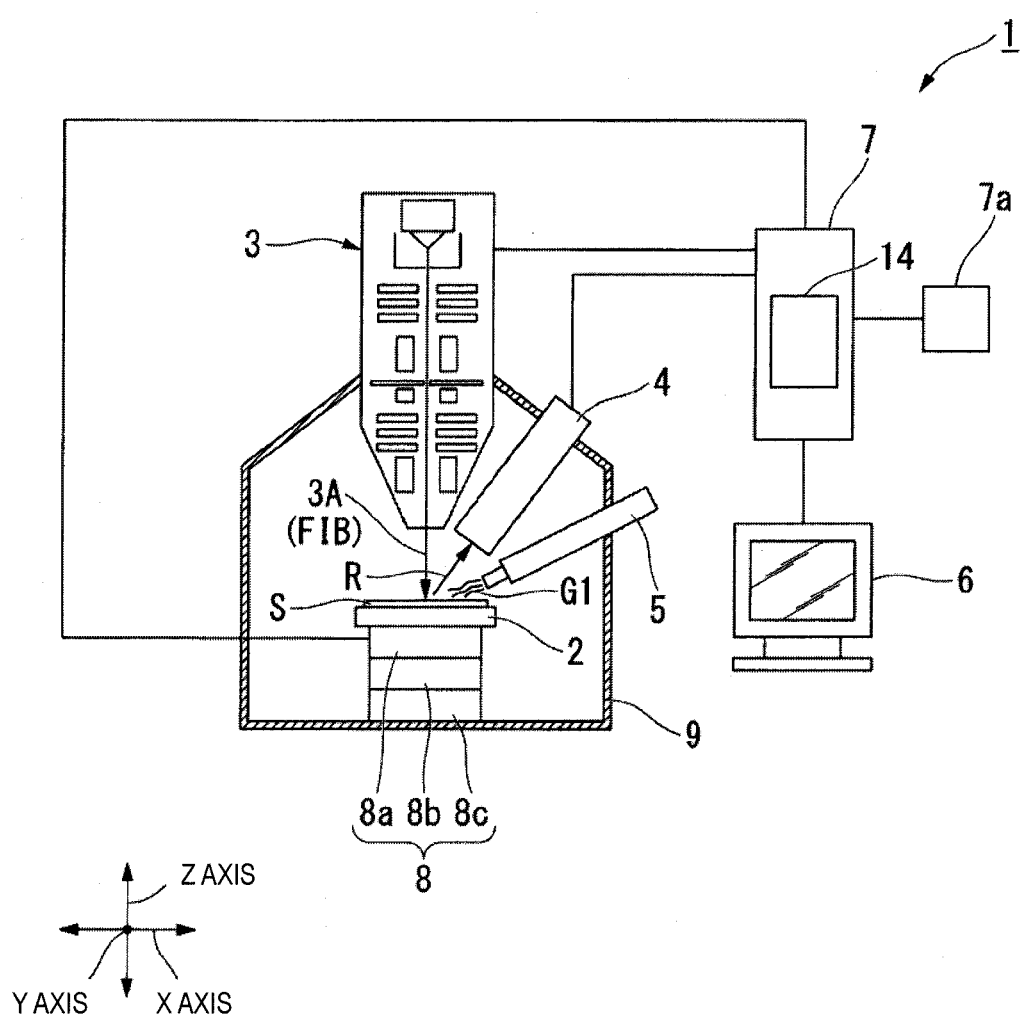
FIG. 1 is a view illustrating the overall configuration a focused ion beam system according to a first illustrative embodiment of the present invention.

As shown in FIG. 1, a focused ion beam system 1 of the present illustrative embodiment mainly includes a stage 2 on which a sample S is placed, a beam lens barrel 3 which radiates an ion beam 3A, a detector 4 which detects secondary charged particles R generated by irradiation with the ion beam 3A, a gas gun 5 which supplies a source gas G1 for forming a deposition film, and a control unit 7 which generates image data based on the detected secondary charged particles R and displays the image data on a display unit 6.

The stage 2 can be displaced on five axes based on instructions of the control unit 7. That is, the stage 2 is supported by a displacing mechanism 8 which includes a horizontal movement mechanism 8a which moves along an X axis and a Y axis which are parallel to a horizontal plane and are perpendicular to each other and along a Z axis which is perpendicular to the X axis and the Y axis, a tilt mechanism 8b which rotates the stage 2 around the X axis (or the Y axis), thereby tilting the stage 2, and a rotation mechanism 8c which rotates the stage 2 around the Z axis.

Therefore, the stage 2 can be displaced on five axes by the displacing mechanism 8, whereby it becomes possible to radiate the ion beam 3A toward a desired position. The stage 2 and the displacing mechanism 8 are accommodated inside a vacuum chamber 9 (a sample chamber). Therefore, irradiation with the ion beam 3A, supply of the source gas G1, and the like are performed inside the vacuum chamber 9.

Figure 2:
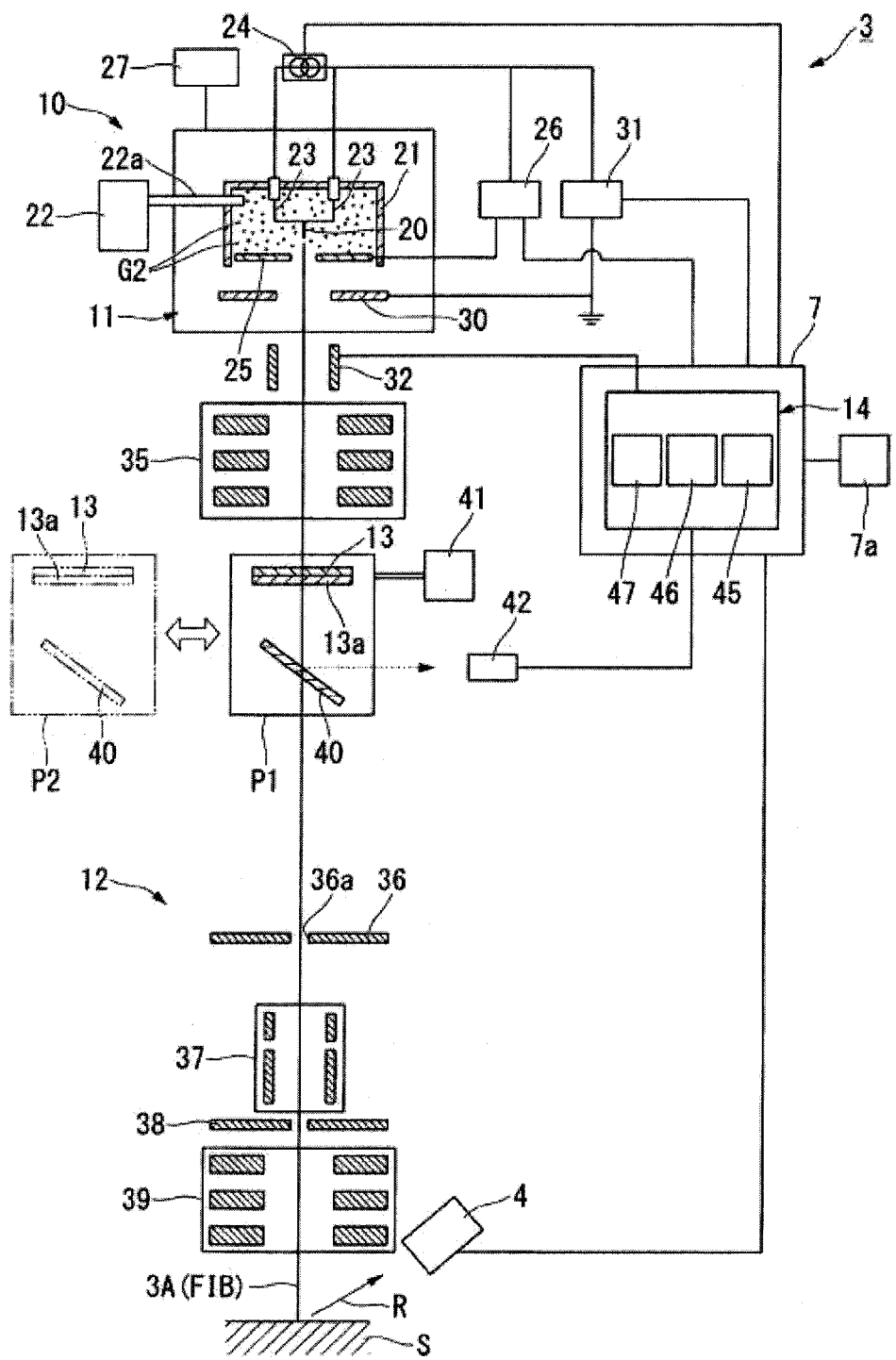
FIG. 2 is a view illustrating the configuration of a beam lens barrel included in the focused ion beam system shown in FIG. 1.

As shown in FIG. 2, the beam lens barrel 3 includes a gas field ion source (GFIS) 10, an ion gun unit 11, a beam optical system 12, a micro-channel plate (MCP) 13, and an image acquiring mechanism 14.

The gas field ion source 10 is a unit which includes an emitter 20 and ionizes a gas G2 at the tip of the emitter 20 to generate gas ions.

Figure 3:
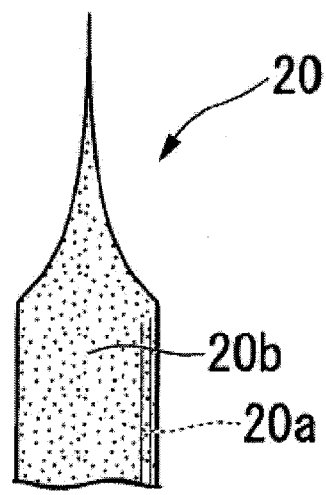
FIG. 3 is an enlarged view of a tip of an emitter shown in FIG. 2.
Figure 4:
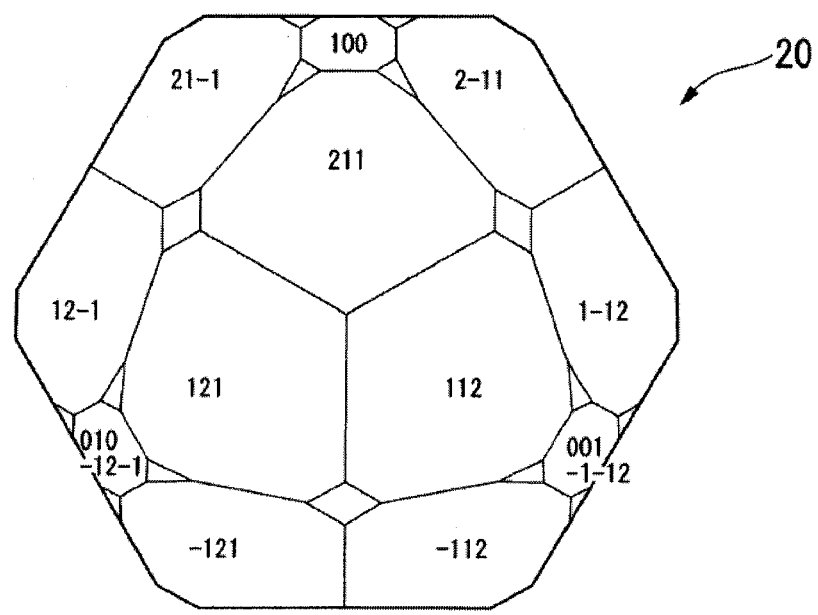
FIG. 4 is a view illustrating a crystal face of the tip of the emitter grown by facet growth and shown in FIG. 3.

The emitter 20 is an aciculate member having a sharp tip as shown in FIG. 3, and is configured, for example, by coating a base material 20a made of tungsten (W) or the like with a noble metal 20b such as iridium (Ir). The tip of the emitter 20 is sharpened at an atomic level, and for example, as an ideal state thereof, the tip is configured such that a crystal structure becomes a pyramidal shape as shown in FIG. 4. FIG. 4 is a view illustrating a crystal face formed by facet growth using heating on the emitter 20 with respect to a crystal axis <111>.

The emitter 20 is accommodated inside an ion generating chamber 21 whose inner side can be maintained in a high vacuum state, and is supported in the accommodated state, as shown in FIG. 2. The ion generating chamber 21 is connected to a gas source 22 through a gas introduction pipe 22a such that a small amount of gas (for example, helium (He) gas) G2 is supplied to the vicinity of the emitter 20.

The emitter 20 is connected to a heating unit 23 for locally heating the tip of the emitter 20. The heating unit 23 is, for example, a filament, and performs a function of locally heating the tip of the emitter 20 to a predetermined temperature based on a current from a current source 24 which operates according to an instruction from the control unit 7, thereby rearranging atoms configuring the emitter 20.

In an opening of the ion generating chamber 21, an extraction electrode 25 is disposed to be separate from the tip of the emitter 20. The extraction electrode 25 has an opening formed at a position facing the tip of the emitter 20. Further, an extraction power source unit 26 for applying an extraction voltage between them is connected between the extraction electrode 25 and the emitter 20. The extraction power source unit 26 applies an extraction voltage, thereby ionizing the gas G2 into gas ions at the tip of the emitter 20 and extracting the gas ions toward the extraction electrode 25.

However, a space including the ion generating chamber 21 and the extraction electrode 25 is cooled by a cooling unit 27. The cooling unit 27 uses a coolant such as liquid helium or liquid nitrogen to cool the whole of the above-described space, thereby capable of cooling the emitter 20.

However, the present invention is not limited to this case, but can be configured in any other ways as long as at least the emitter 20 can be cooled. For example, a cooling block, a refrigerator, or the like is used to cool only the emitter 20.

Incidentally, the emitter 20, the gas source 22, the heating unit 23, the extraction electrode 25, the extraction power source unit 26, the ion generating chamber 21 and the cooling unit 27 configure the above-described gas field ion source 10.

A cathode 30 having a ground potential is provided below the extraction electrode 25. An acceleration voltage from an acceleration power source unit 31 is applied between the cathode 30 and the emitter 20, whereby energy is applied to the gas ions. As a result, the gas ions are accelerated while being further extracted toward the sample S, thereby being converted into the ion beam 3A.

Therefore, the cathode 30 and the acceleration power source unit 31 function as the ion gun unit 11 which radiates the gas ions as the ion beam 3A.

Figure 5:
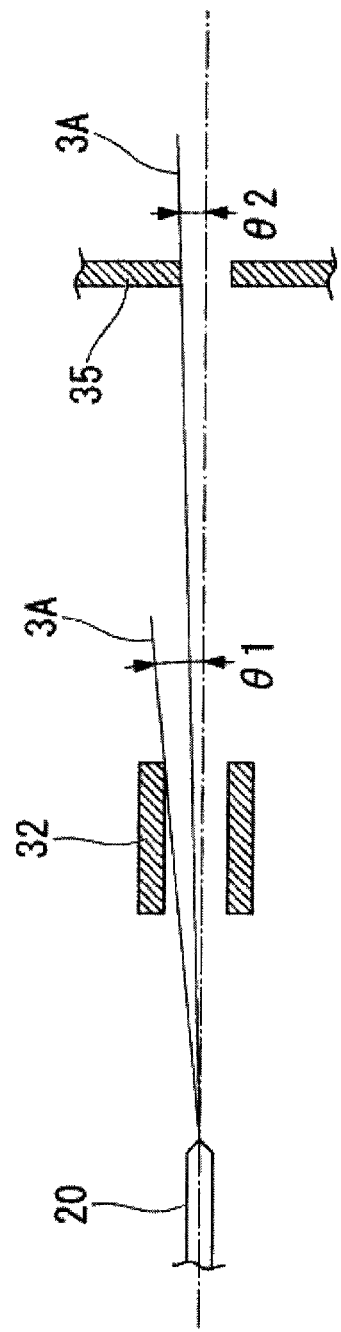
FIG. 5 is a view illustrating a positional relationship between an alignment electrode and a focusing lens electrode shown in FIG. 2.

An alignment electrode 32 is provided below the cathode 30. The alignment electrode receives an alignment voltage, thereby adjusting the radiation direction of the ion beam 3A. As shown in FIG. 5, the alignment electrode 32 is disposed such that a greater part of the peripheral component of the ion beam 3A enters the alignment electrode 32 than a focusing lens electrode 35 (to be described below). Specifically, the alignment electrode 32 is disposed such that an estimated angle $\theta 1$ (for example, 3° to 4°) at which the ion beam 3A enters the alignment electrode 32 is larger than an estimated angle $\theta 2$ (for example, 1° to 2°) at which the ion beam 3A enters the focusing lens electrode 35.

Further, as shown in FIG. 2, the focusing lens electrode (a condenser lens) 35 is disposed below the alignment electrode 32 to focus the ion beam 3A, thereby converting the ion beam 3A into a focused ion beam (FIB).

An orifice 36 for narrowing the ion beam 3A is provided below the focusing lens electrode 35. This orifice 36 has an opening 36a having a small diameter, and functions as a member for preventing mixing of the gas G2 which prevents the source gas G1 supplied to the vicinity of the sample S by the gas gun 5 from being mixed into the ion generating chamber 21 of the gas field ion source 10 inside the beam lens barrel 3.

Incidentally, a changeable diaphragm capable of freely changing the diameter of the opening 36a may be provided instead of the orifice 36.

A scan electrode 37 for radiating the ion beam 3A onto the sample S is provided below the orifice 36. Further, an objective-lens diaphragm 38 is provided below the scan electrode 37, and an objective-lens electrode 39 for focusing the ion beam 3A on the sample S is provided below the objective-lens diaphragm 38.

The focusing lens electrode 35, the orifice 36, the scan electrode 37, the objective-lens diaphragm 38, and the objective-lens electrode 39 configure the beam optical system 12 for focusing the ion beam 3A, thereby converting the ion beam 3A into the focused ion beam (FIB) and radiating the focused ion beam onto the sample S.

Incidentally, although not shown, an astigmatism corrector and a beam-position adjusting mechanism used in a related-art focused ion beam system are also included in the beam optical system.

Figure 7:
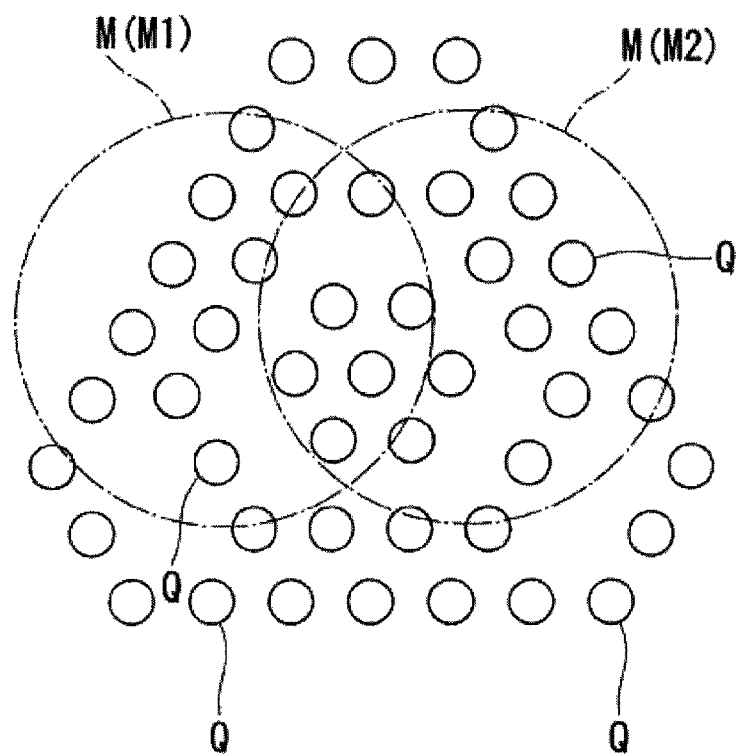
FIG. 7 is a view illustrating an example of an FIM image of the tip of the emitter acquired by using the MCP.

The MCP 13 and a mirror 40 are provided between the focusing lens electrode 35 and the orifice 36 to be movable between a set position P1 located on the light path of the ion beam 3A and a deviated position P2 deviated from the light path. The MCP 13 and the mirror 40 move in synchronization with each other by the moving mechanism 41 which operates based on an instruction from the control unit 7. That is, the MCP 13 and the mirror 40 are controlled such that when irradiating the sample S with the ion beam 3A, they move to the deviated position P2 deviated from the light path at a same timing, and when acquiring an FIM image M (see FIG. 7) of the tip of the emitter 20, they move to the set position P1 located on the light path.

During acquiring of an FIM image M, the gain of the MCP 13 is automatically adjusted. The positions of the MCP 13 and the mirror 40 are always recorded, and the MCP 13 and the mirror 40 are set at the same set position P1 located on the light path every time.

A fluorescent screen 13a is provided on the lower surface of the MCP 13. An FIM image M amplified by the MCP 13 enters the fluorescent screen 13a. As a result, the FIM image M of the tip of the emitter 20 is projected onto the fluorescent screen 13a. Then, the projected FIM image M is reflected by the mirror 40, thereby changing its direction and being guided to an image acquiring unit 42 such as a CCD camera. Accordingly, the FIM image M can be acquired. The acquired FIM image M is transmitted to the image acquiring mechanism 14.

As shown in FIG. 1, the detector 4 detects secondary charged particles R such as secondary electrons, secondary ions, reflected ions, and scattered ions generated from the sample S during radiation of the ion beam 3A onto the sample S, and outputs the detection result to the control unit 7.

The gas gun 5 supplies, as the source gas G1, a compound gas containing a material (for example, phenanthrene, platinum, carbon, or tungsten) which is raw material for a deposition film. The source gas G1 is decomposed and separated into a gas component and a solid component by the secondary charged particles R generated by radiation of the ion beam 3A. Then, the solid component of the separated two components is deposited, thereby becoming the deposition film.

Incidentally, for the gas gun 5, a material (for example, xenon fluoride, chlorine, iodine, or water) for selectively accelerating etching can be used. For example, in a case where the sample S is Si-based, xenon fluoride can be used, and in a case where the sample S is organic-based, water can be used. Also, it is possible to advance etching on a specific material by simultaneously performing irradiation with the ion beam 3A.

The control unit 7 generally controls the above-described individual components, and can appropriately change the extraction voltage, the acceleration voltage, the beam current and the like. Accordingly, it becomes possible to freely adjust the beam diameter of the ion beam 3A. Therefore, it becomes possible not only to acquire an observation image but also to locally perform etching (crude processing, finish processing, or the like) on the sample S.

The control unit 7 converts the secondary charged particles R detected by the detector 4 into a luminance signal, thereby generating observation image data, and then controls the display unit 6 such that the display unit 6 outputs an observation image based on the observation image data. Therefore, it becomes possible to confirm the observation image through the display unit 6. The control unit 7 is connected to an input unit 7a which can be used for an operator to input, and controls the individual components based on a signal input by the input unit 7a. That is, the operator can use the input unit 7a to irradiate a desired area with the ion beam 3A, thereby observing the desired area, or to perform etching on a desired area, or to irradiate a desired area with the ion beam 3A while supplying the source gas G1 to the desired area, thereby depositing a deposition film.

As shown in FIG. 2, the image acquiring mechanism 14 is a mechanism for acquiring an FIM image M of the tip of the emitter 20, and acquires an FIM image M through the image acquiring unit 42 in the present illustrative embodiment.

Figure 9:
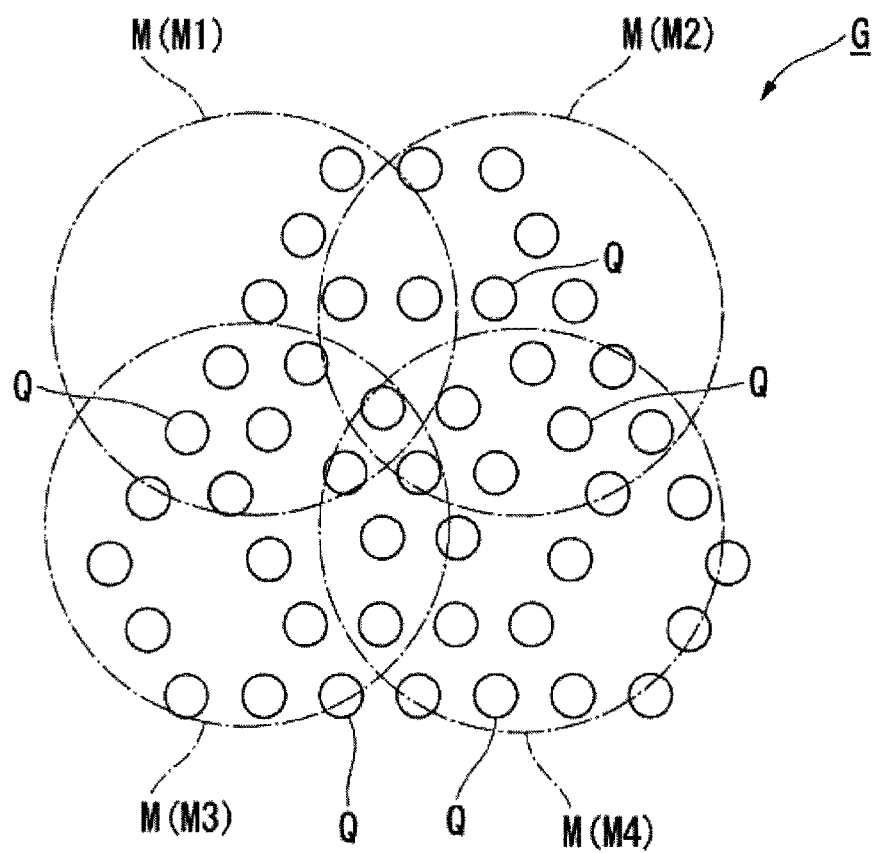
FIG. 9 is a view illustrating an example when combining a plurality of FIM images acquired by using the MCP to generate one composite FIM image.

The image acquiring mechanism 14 is, for example, partially incorporated in the control unit 7, and includes a memory (a storage unit) 45 which stores acquired FIM images M, an alignment control unit 46 which applies the alignment voltage to the alignment electrode 32 while appropriately changing the alignment voltage, and an image processing unit 47 which performs image processing to combine a plurality of FIM images M with one another which are acquired when applying different alignment voltages and stored in the memory 45, thereby generating one composite FIM image G (see FIG. 9).

The alignment electrode 32 functions as a part of the image acquiring mechanism 14.

When storing an FIM image M in the memory 45, the image acquiring mechanism 14 stores the FIM image M, for example, in association with the voltage value of the alignment voltage applied. Therefore, the image processing unit 47 can combine FIM images M acquired when applying alignment voltages which are surely different. The image processing unit 47 of the present illustrative embodiment performs image processing based on the patterns of bright points Q (see FIG. 7) which appear in the FIM images M, respectively, such that the plurality of FIM images are combined with one another. This feature will be further described below.

When acquiring an FIM image M, the control unit 7 stops applying the voltage to the focusing lens electrode 35. Then, during this period, the image acquiring mechanism 14 acquires an FIM image M.

(Functions of Focused Ion Beam System)

Next, operations of the focused ion beam system 1 will be described below.

First, as initial setting, the extraction voltage, the acceleration voltage, a gas pressure at which the gas G2 will be supplied, a temperature, and the like are set to optimal values, and the MCP 13 and the mirror 40 are moved to the deviated position P2 deviated from the light path of the ion beam 3A.

After the initial setting ends, at radiating the ion beam 3A onto the sample S, first, the gas G2 is supplied from the gas source 22 into the ion generating chamber 21, and the emitter 20 is cooled to a predetermined temperature, for example, about 20 K, by the cooling unit 27. After supply of the gas G2 and cooling on the emitter 20 is sufficiently performed, the extraction voltage is applied between the extraction electrode 25 and the emitter 20 by the extraction power source unit 26. Then, the electric field of the tip of the emitter 20 becomes higher, and thus the gas G2 in the ion generating chamber 21 is ionized into gas ions at the tip of the emitter 20 by the electric field. Then, the gas ions are drawn toward the extraction electrode 25 repulsively from the emitter 20 having a positive potential.

Thereafter, the acceleration voltage is applied between the cathode 30 and the emitter 20 of the ion gun unit 11, whereby the drawn gas ions are further accelerated, thereby being converted into the ion beam 3A, which is radiated toward the sample S. Then, the ion beam 3A is focused by the beam optical system 12 having the focusing lens electrode 35, thereby becoming the focused ion beam (FIB), which is radiated onto the sample S.

Accordingly, observation on the sample S, etching, or the like can be performed. In this case, it is possible to apply a voltage to the scan electrode 37 to appropriately operate the scan electrode, such that the sample S is scanned with the ion beam 3A. Therefore, observation or processing can be performed over a wide range.

When radiating the ion beam 3A, as shown in FIG. 1, it is possible to supply the source gas G1 from the gas gun 5, thereby generating a deposition film. That is, the secondary electrons generated by radiation of the ion beam 3A decompose the source gas G1 into a gas component and a solid component and separate the gas component and the solid component from each other. Then, of the separated two components, only the solid component is deposited on the sample S, thereby forming a deposition film.

Accordingly, in addition to the observation or processing, a deposition film can be generated. Therefore, according to the focused ion beam system 1 of the present illustrative embodiment, by appropriately using these features, it is possible to widely use the focused ion beam system as a microscope or an apparatus for performing length measurement, cross-section observation, cross-section length measurement, preparation of a TEM sample S, mask repair, drawing, and the like.

Meanwhile, according to the focused ion beam system 1 of the present illustrative embodiment, since the focused ion beam system 1 includes the image acquiring mechanism 14, it is possible to appropriately perform FIM observation on the tip of the emitter 20.

Next, operations of performing FIM observation will be described in detail.

First, the moving mechanism 41 is operated by an instruction from the control unit 7, whereby the MCP 13 and the mirror 40 are moved to the set position P1 located on the light path of the ion beam 3A as shown in FIG. 2. In this state, the ion beam 3A is radiated. Then, the ion beam 3A enters the MCP 13 and is converted into electrons, which are amplified and then enter the fluorescent screen 13a. Therefore, it is possible to project an FIM image M onto the fluorescent screen 13a. This projected FIM image M is acquired by the image acquiring unit 42 through the mirror 40, and is transmitted to the image acquiring mechanism 14.

The image acquiring mechanism 14 stores the acquired FIM images M in the memory 45. Incidentally, the image acquiring mechanism 14 acquires those FIM images M in a state where the voltage to the focusing lens electrode 35 is applied and while changing the alignment voltage to be applied from the alignment control unit 46 to the alignment electrode 32.

If the alignment voltage is applied to the alignment electrode 32, it is possible to deflect the ion beam 3A according to the voltage value of the alignment voltage and the like, and it is possible to change the radiation direction of the ion beam 3A. Therefore, although a portion of the peripheral component or the like of the ion beam 3A is blocked by the focusing lens electrode 35 when the ion beam 3A passes through the focusing lens electrode 35, it is possible to pass the blocked portion of the ion beam 3A by changing the alignment voltage. Therefore, before and after the alignment voltage is changed, it is possible to acquire FIM images M of different visual fields.

Figure 6:
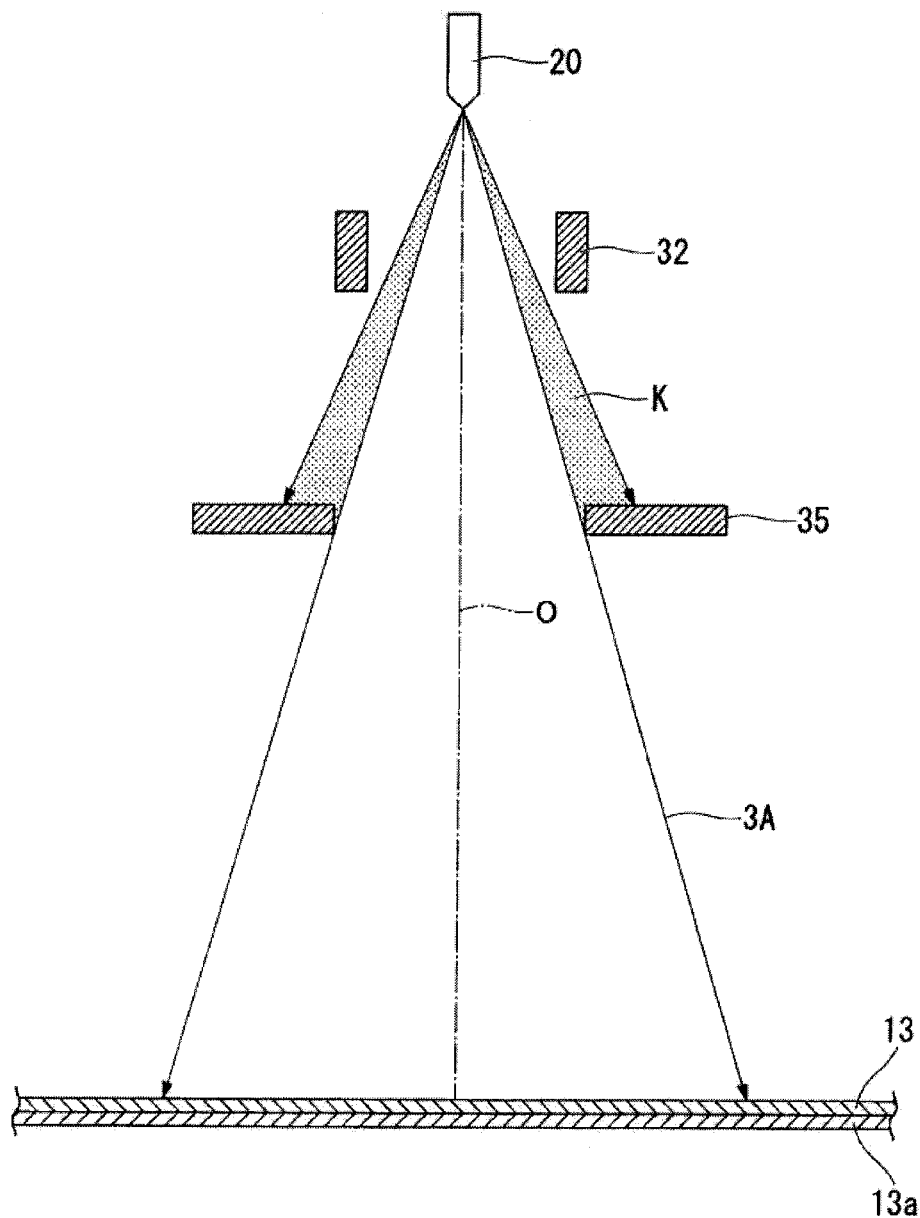
FIG. 6 is a view illustrating a relation of the alignment electrode, the focusing lens electrode and an MCP shown in FIG. 2 in a state where an ion beam is radiated without applying an alignment voltage to the alignment electrode.

Specifically, as shown in FIG. 6, for example, in a state where the alignment voltage is not applied to the alignment electrode 32, when the ion beam 3A passes through the focusing lens electrode 35, the peripheral component (oblique portions shown in FIG. 6) K of the ion beam 3A is blocked by the focusing lens electrode 35. Therefore, only the central portion of the ion beam 3A enters the MCP 13, whereby it is possible to acquire an FIM image M (M1) shown in FIG. 7.

Figure 8:
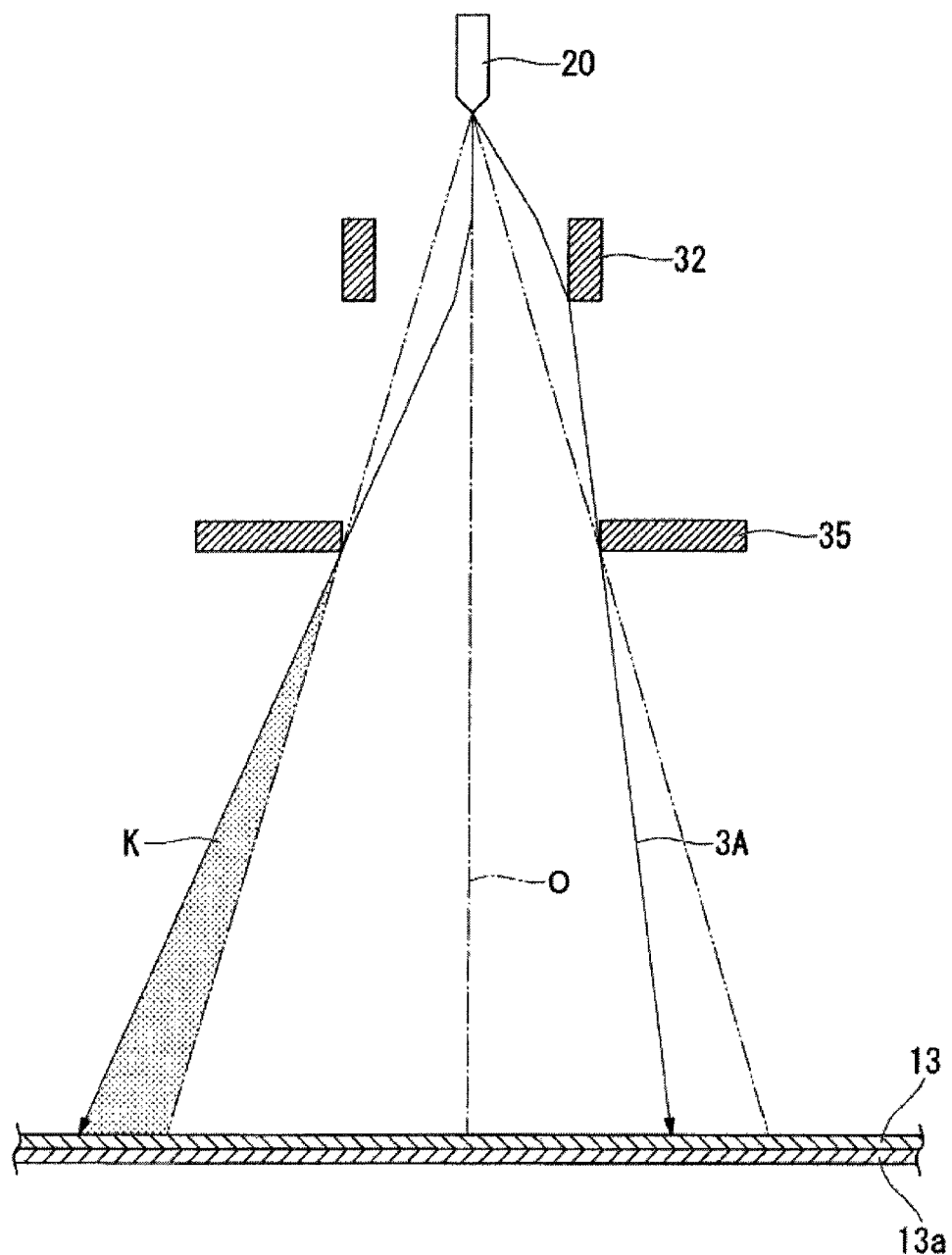
FIG. 8 is a view illustrating a state where an ion beam is radiated while an alignment voltage is applied to the alignment electrode from the state shown in FIG. 6.

Then, if the alignment voltage is applied as shown in FIG. 8, for example, since the ion beam 3A is deflected by the alignment electrode 32, whereby the radiation direction changes, it is possible to pass the blocked peripheral component K such that the peripheral component enters the MCP 13. Therefore, it is possible to acquire an FIM image M (M2) of a visual field which is different from the FIM image M (M1) and is as shown in FIG. 9.

As described above, the image acquiring mechanism 14 can acquire, for example, four FIM images M (M1 to M4) of different visual fields as shown in FIG. 9, by changing the alignment voltage a number of times, and stores the FIM images in the memory 45. It is noted that the number of FIM images M is not limited to four.

If acquisition of the FIM images M ends, the image acquiring unit 42 combines the plurality of FIM images M (M1 to M4) with one another as shown in FIG. 9, thereby generating one composite FIM image G.

Specifically, the image acquiring unit 42 combines the plurality of FIM images based on the patterns of bright points Q which appear in the FIM images M, respectively. For example, the image acquiring unit 42 combines the plurality of FIM images M such that the pattern of common bright points Q of a plurality of bright points Q appearing in a first FIM image M and a second FM image M overlaps with each other. Accordingly, it is possible to combine the FIM images M while performing accurate matching and obtain an accurate composite FIM image G.

As a result, it is possible to acquire a wide-range FIM image of the tip of the emitter 20 without being influenced by the focusing lens electrode 35.

Especially, since a bright point Q corresponding to a protruding portion of the tip of the emitter 20 appears in each FIM image M, it is possible to perform FIM observation on the crystal structure of the tip of the emitter 20 over a wide range by the composite FIM image G. Therefore, it is possible to accurately grasp whether the crystal structure of the tip of the emitter 20 is in an ideal state (for example, a state where the tip of the emitter 20 has a pyramid-shaped atomic array and the tip edge is configured by one or more atoms).

Therefore, it is possible to accurately grasp the progress status of etching, for example, when using the focused ion beam system 1 to etch the tip of the emitter 20 by field-assisted gas etching, and it is possible to finish the tip of the emitter 20 in a desired sharp state.

Also, when performing field-assisted gas etching, as the gas G2 which is supplied from the gas source 22 into the ion generating chamber 21, instead of helium gas, for example, oxygen, or nitrogen, or a mixed gas containing oxygen and nitrogen may be supplied. Therefore, it is possible to take atoms from tungsten constituting the base material 20a of the emitter 20, thereby performing field-assisted gas etching, and it is possible to gradually shave the tip of the emitter 20, thereby performing sharpening at an atomic level. In this case, as sharpening advances, atoms configuring the tip edge of the emitter 20 decrease, so that it is possible to confirm the progress status of etching by confirming the bright points Q by FIM observation.

Incidentally, FIM observation is not limited to a case of performing the above-described field-assisted gas etching, and may be performed in a case of performing a treatment (rearrangement of atoms) for restoring the crystal structure of the tip of the emitter 20 to the original state, for example, in a case where the crystal structure is broken during use.

In the case of performing that treatment, after the cooling unit 27 is stopped, the heating unit 23 is operated, thereby locally heating the tip of the emitter 20 (for example, at 800° C. to 900° C. for several minutes). As a result, the atoms configuring the tip of the emitter 20 are rearranged, and it becomes possible to restore the crystal structure of the tip of the emitter 20 to the original crystal structure shown in FIG. 4. In this case, after the rearrangement, it is possible to accurately determine whether the crystal structure after the rearrangement is in the original ideal state, by performing FIM observation.

As described above, according to the focused ion beam system 1 of the present illustrative embodiment, since it is possible to acquire a wide-range FIM image of the tip of the emitter 20 by the composite FIM image G, FIM observation can be performed in a wide visual field. Therefore, in some cases, such as a case of etching the tip of the emitter 20 by field-assisted gas etching, or a case of performing a treatment on the tip of the emitter 20, it is possible to accurately grasp the progress status of etching, and it is easy to surely finish the tip of the emitter 20 in a desired sharp state.

When the image acquiring unit 42 combines a plurality of FIM images M to generate a composite FIM image G, since bright points Q appearing respectively in the FIM images M are used, it is unnecessary to separately prepare marks or others for combining. Therefore, it is possible to simply and accurately perform image processing operation.

Although the focusing lens electrode 35 is disposed close to the emitter 20 in order to secure performance of the focused ion beam system 1, so that the focusing lens electrode 35 is disposed immediately above the MCP 13, it is possible to perform FIM observation on the tip of the emitter 20 over a wide range based on the composite FIM image G without being influenced by the focusing lens electrode 35.

In the first illustrative embodiment, an FIM image M is acquired in a state where applying of the voltage to the focusing lens electrode 35 is stopped. However, an FIM image M may be acquired in a state where the focusing lens electrode 35 is operated.

However, if the focusing lens electrode 35 is stopped, it is possible to pass the ion beam 3A without being focused (refracted) by the focusing lens electrode 35, and thus it is possible to make the ion beam 3A enter the MCP 13 over a wider area. Therefore, it is possible to acquire an accurate FIM image M which is clearer and is not influenced by refraction, and it is easy to perform more accurate FIM observation.

Second Illustrative Embodiment

Subsequently, a second illustrative embodiment of the present invention will be described.

A difference from the first illustrative embodiment is that in the first illustrative embodiment, the MCP 13 is used to perform FIM observation (an MCP system) on the emitter 20, whereas in the second illustrative embodiment, FIM observation (a Scanning-FIM system) is performed by scanning the sample S with the ion beam 3A.

Here, components of the second illustrative embodiment similar to components of the first illustrative embodiment are denoted by the same reference symbols and will not be described.

(Configuration of Focused Ion Beam System)

Figure 10:
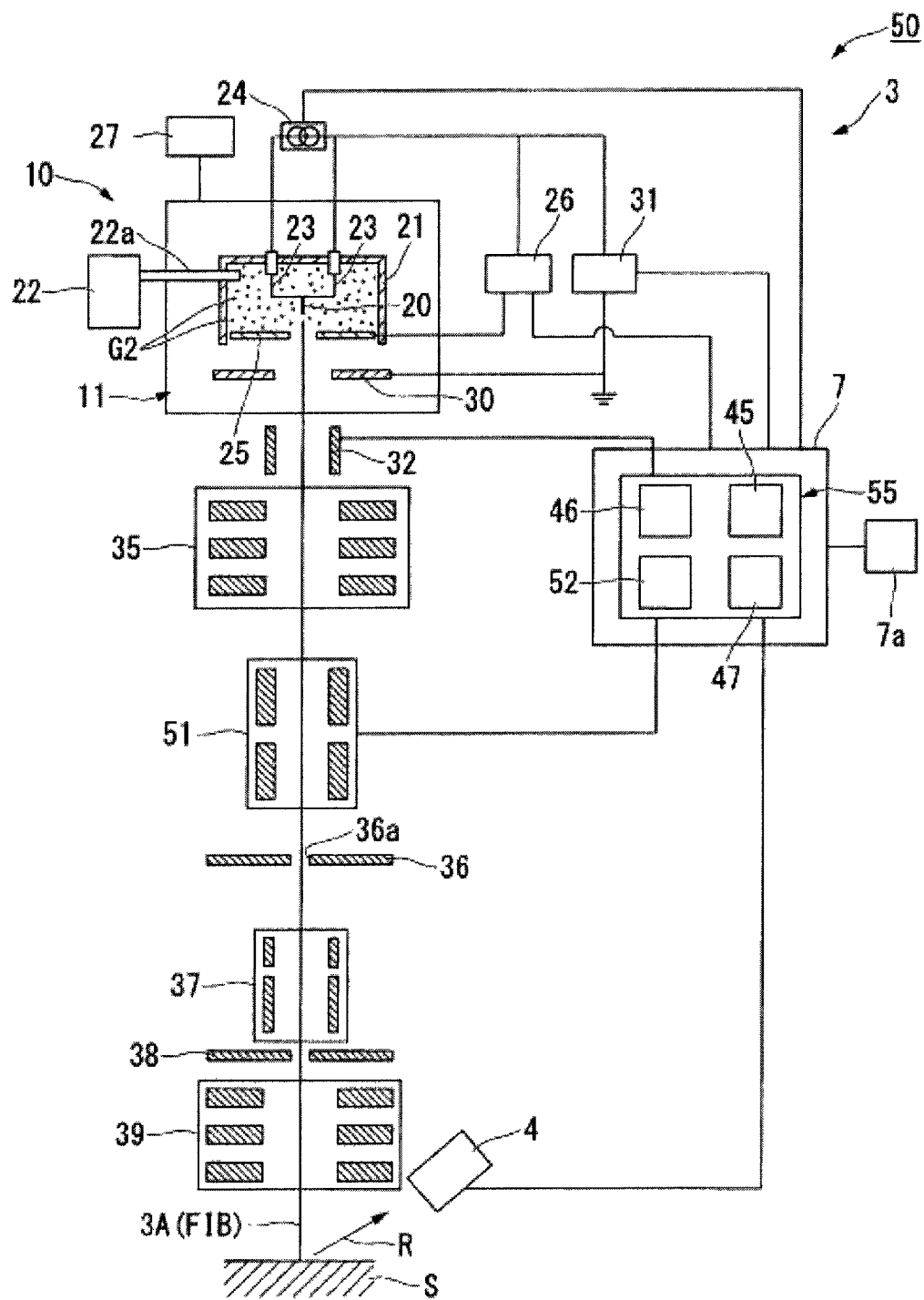
FIG. 10 is a view illustrating a focused ion beam system according to a second illustrative embodiment of the present invention, and illustrating the configuration of a beam lens barrel.

As shown in FIG. 10, a focused ion beam system 50 of the present illustrative embodiment includes two-stage deflector (deflectors) 51, and a deflection control unit 52 which controls the two-stage deflector 51, instead of the MCP 13, the mirror 40, the image acquiring unit 42, and the like of the first illustrative embodiment.

The two-stage deflector 51 is disposed in two stages of an upper stage and a lower stage between the focusing lens electrode 35 and the orifice 36, and has functions of correcting the radiation direction of the ion beam 3A having passed through the focusing lens electrode 35 and scanning a sample S with the corrected ion beam 3A in a direction parallel to the surface of the sample S. Especially, the two-stage deflector 51 performs the correction such that the radiation direction of the ion beam 3A having passed through the focusing lens electrode 35 becomes parallel to the axial line O of the emitter 20.

The deflection control unit 52 applies correction signals (correction voltages) to the two-stage deflectors 51, thereby controlling the two-stage deflector 51 such that the two-stage deflector 51 performs the above-described correction, and applies scan signals (scan voltages) to the two-stage deflector 51, thereby controlling the two-stage deflector 51 such that the two-stage deflector 51 performs the scanning. Accordingly, the deflection control unit 52 controls the operation of the two-stage deflector 51. Specifically, the deflection control unit 52 applies signals obtained by adding the scan signals to the correction signals, to the two-stage deflector 51 of the upper stage and the lower stage, thereby performing control such that the two-stage deflector 51 simultaneously perform the above-described correction and scanning. In this case, as the scan signals, signals having the same absolute value and different polarities are applied to the two-stage deflector 51 of the upper stage and the lower stage. Therefore, it becomes possible to perform parallel scanning with the ion beam 3A.

Figure 11:
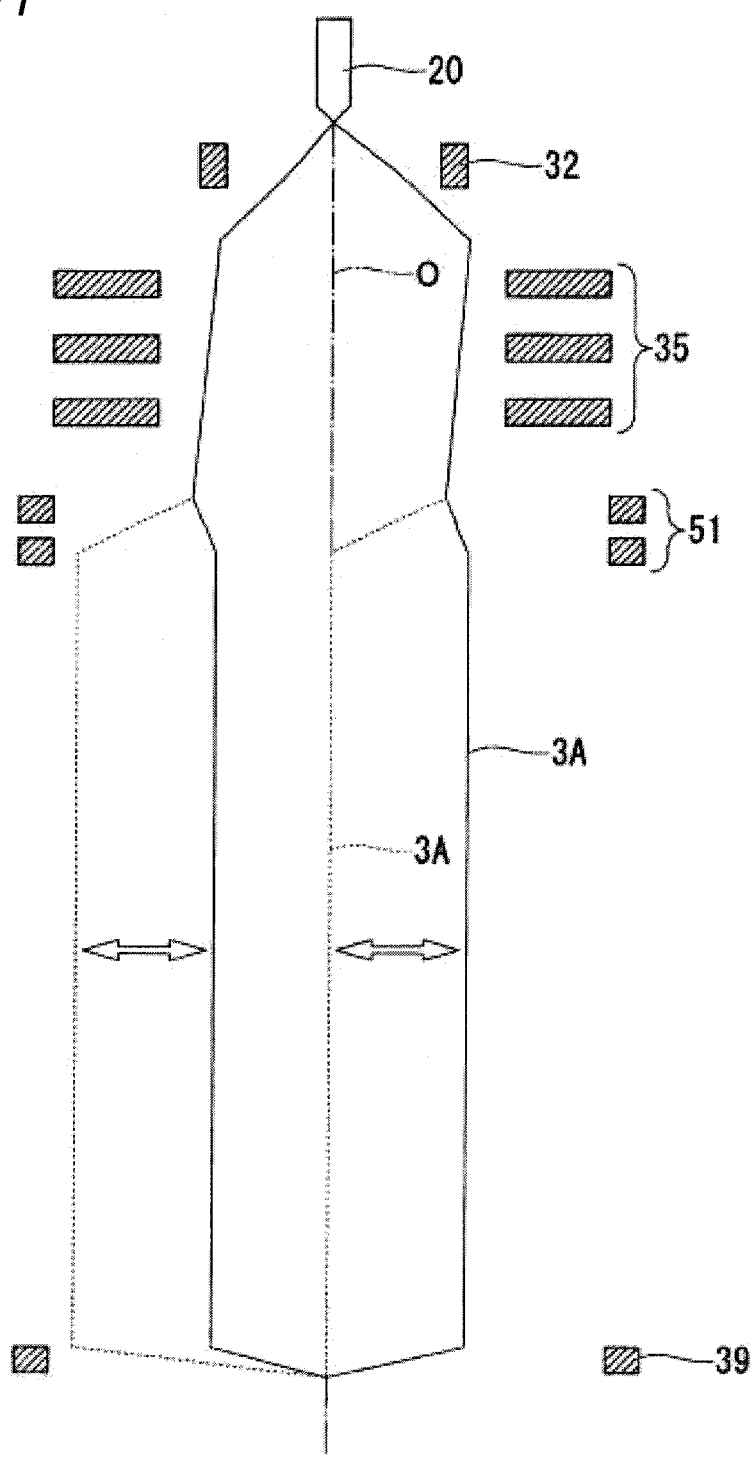
FIG. 11 is a view illustrating a relation of an alignment electrode, a focusing lens electrode, and a two-stage deflector shown in FIG. 10 in a state where an ion beam is scanned while the irradiation direction of the ion beam is corrected by the two-stage deflector.
Figure 12:
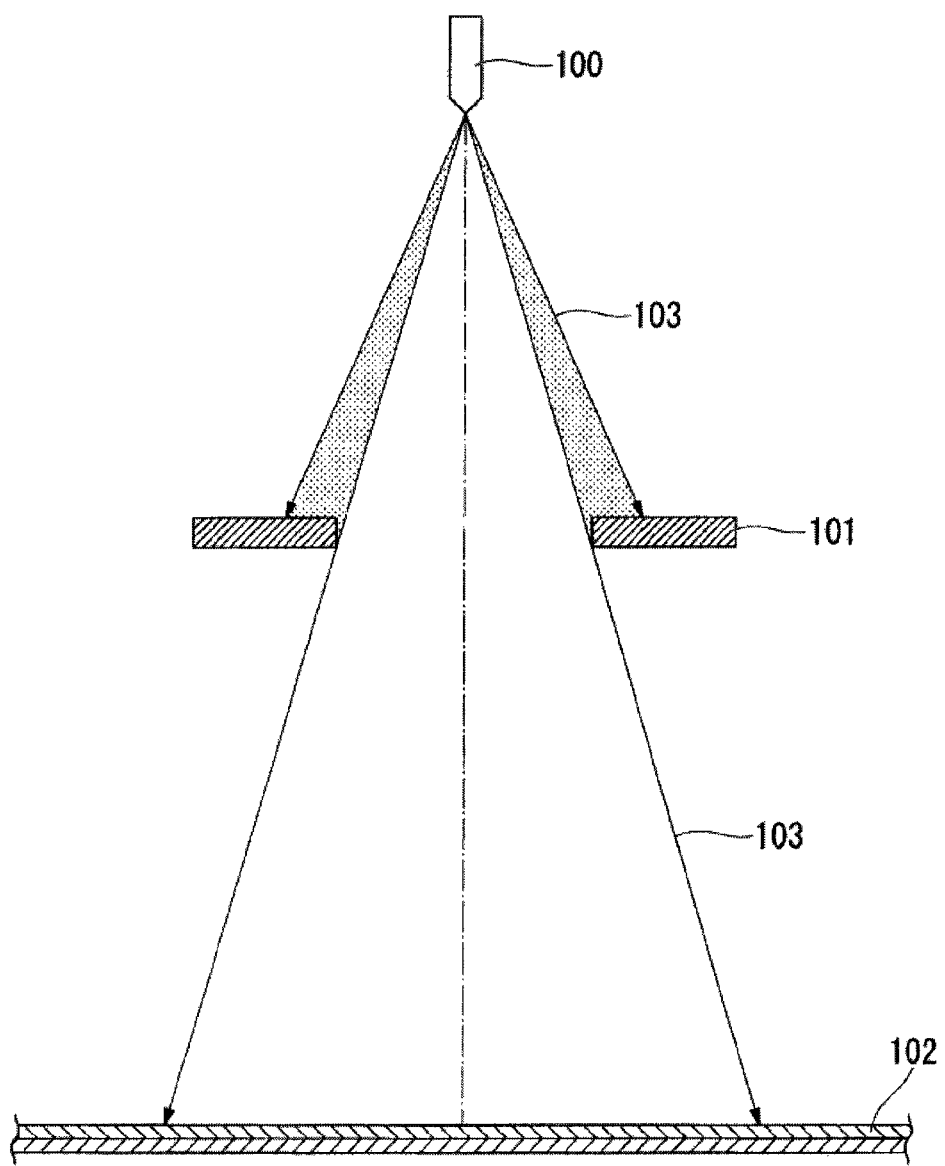
FIG. 12 is a view illustrating a relation between a focusing lens electrode and an MCP in a related-art system in a state where an ion beam is radiated.

In FIG. 11, the trajectory of the ion beam 3A before the scan signals are applied is shown by a solid line, and the trajectory of the ion beam 3A after the scan signals are applied is shown by a broken line. Therefore, it becomes possible to perform scanning with the ion beam 3A as shown by arrows between the solid line and the dotted line. Incidentally, it is possible to perform scanning by the ion beam 3A with a large scan width by increasing the scan signals.

(Functions of Focused Ion Beam System)

Subsequently, operations of the focused ion beam system 50 to perform FIM observation on the emitter 20 will be described.

First, as shown in FIG. 11, the ion beam 3A whose radiation direction is changed by the alignment electrode 32 is focused and becomes a state where the radiation direction is inclined with respect to the axial line O of the emitter 20 by refraction effect while passing through the focusing lens electrode 35, and then enters the two-stage deflector 51. In this case, the two-stage deflector 51 corrects the inclination of the ion beam 3A by applying of the correction signal from the deflection control unit 52, thereby readjusting the radiation direction such that the radiation direction becomes parallel to the axial line O of the emitter 20. Therefore, it becomes possible to make the ion beam 3A (FIB) focused on the surface of the sample S perpendicularly enter the sample S.

In addition, the two-stage deflector 51 scans the sample S in a direction parallel to the surface of the sample S with the ion beam 3A to be incident perpendicularly on the surface of the sample S, by applying of the scan signals from the deflection control unit 52.

Then, the scanned ion beam 3A enters the sample S, thereby generating secondary charged particles R as shown in FIG. 10, and the detector 4 detects the secondary charged particles R. The image acquiring mechanism 55 synchronizes a detection signal detected based on a variation of the intensity of the secondary charged particles R by the detector 4, with the scan signals applied to the two-stage deflector 51, thereby capable of acquiring a field emission pattern image of the tip of the emitter 20, and thus capable of acquiring an FIM image M.

Incidentally, in the present illustrative embodiment, the two-stage deflector 51, the deflection control unit 52, the detector 4, the memory 45, the alignment electrode 32, the alignment control unit 46, and the image acquiring unit 42 function as the image acquiring mechanism 55.

In the meantime, FIM images M are acquired in the same way while the alignment voltage is changed, whereby it is possible to acquire a plurality of FIM images M of different visual fields. Therefore, similarly to the first illustrative embodiment, it is possible to generate a composite FIM image G by the image acquiring unit 42, and it is possible to perform FIM observation on the tip of the emitter 20 in a wide visual field.

Especially, since scanning is performed in a direction parallel to the surface of the sample S in a state where the two-stage deflector 51 re-adjusts the radiation direction of the ion beam 3A to a direction perpendicular to the surface of the sample S, as shown in FIG. 10, it is possible to pass the ion beam 3A through the orifice 36 having the small-diameter opening 36a provided for preventing the source gas G1 from being mixed with the ion generating chamber 21 side, when scanning.

Therefore, even in a case where the orifice 36 is provided, it is possible to surely perform FIM observation on the tip of the emitter 20 over a wide range.

Further, in the second illustrative embodiment, an FIM image M is acquired by synchronizing the detection signal detected based on a variation of the intensity of the secondary charged particles R by the detector 4, with the scan signals applied to the two-stage deflector 51. However, the present invention is not limited thereto.

For example, a Faraday cup may be disposed inside the vacuum chamber 9, and the ion beam 3A may be controlled such that the ion beam enters the Faraday cup. Thereafter, an FIM image M may be acquired by synchronizing a detection signal (current variation) of the beam current of the ion beam 3A having entered the Faraday cup, with the scan signals applied to the two-stage deflector 51.

While the present invention has been shown and described with reference to certain illustrative embodiments thereof, it will be understood by those skilled in the art that various changes in form and details may be made therein without departing from the spirit and scope of the invention as defined by the appended claims.

In the above-described illustrative embodiments, the base material 20a of the emitter 20 is made of tungsten (W). However, the base material 20a may be made of molybdenum (Mo). Also, although the noble metal 20b to coat the surface of the base material 20a is iridium (Ir), any other material such as palladium (Pd), rhodium (Rh), rhenium (Re), or osmium (Os) may be used as the noble metal 20b. Especially, since the surface of the emitter 20 is coated by the noble metal 20b which is one of materials as described above, the emitter 20 has chemical resistance. Also, in terms of chemical resistance, it is preferable to use iridium (Ir).

Also, in the above-described illustrative embodiments, as the gas G2 which is supplied into the ion generating chamber 21, helium (He) gas is supplied. However, the present invention is not limited thereto. For example, argon (Ar) gas, neon (Ne) gas, krypton (Kr) gas, xenon (Xe) gas, or the like may be used. Further, besides noble gases, a gas such as hydrogen ($H_2$) or oxygen ($O_2$) can be used. In this case, according to use of the ion beam 3A, the kind of gas G2 may be switched in midstream or two or more gases G2 may be mixed and then supplied.

What is claimed is:

1. A focused ion beam system comprising:
    a gas field ion source which includes an emitter with a sharp tip, and is configured to ionize a gas at the tip of the emitter to generate gas ions;
    an ion gun unit which is configured to accelerate the gas ions and radiate the gas ions as an ion beam while extracting the gas ions toward a sample;
    a beam optical system which includes at least a focusing lens electrode, and is configured to radiate the ion beam onto the sample while focusing the ion beam; and
    an image acquiring mechanism which is configured to acquire an FIM image of the tip of the emitter based on the ion beam,
    wherein the image acquiring mechanism includes:
        an alignment electrode which is disposed between the ion gun unit and the focusing lens electrode, and is configured to adjust a radiation direction of the ion beam;
        an alignment control unit which is configured to apply an alignment voltage to the alignment electrode;
        a storage unit which is configured to store the acquired FIM image; and
        an image processing unit which is configured to perform image processing to combine a plurality of FIM images to generate one composite FIM image, wherein the plurality of FIM images are acquired when applying different alignment voltages and are stored in the storage unit.

2. The focused ion beam system according to claim 1, wherein the image processing unit is configured to combine the plurality of FIM images based on patterns of bright points appearing in the FIM images.

3. The focused ion beam system according to claim 1, further comprising:
    a micro-channel plate which is disposed between the focusing lens electrode and the sample, and which is configured to be movable between a position located on a light path of the ion beam and a position deviated from the light path, and to receive the ion beam having passed through the focusing lens electrode to project the FIM image onto a fluorescent screen,
    wherein the image acquiring mechanism is configured to acquire the FIM image projected on the fluorescent screen.

4. The focused ion beam system according to claim 3, wherein the image acquiring mechanism is configured to acquire the FIM image in a state where applying of a voltage to the focusing lens electrode is stopped.

5. The focused ion beam system according to claim 1, further comprising:
    a deflector which is disposed between the focusing lens electrode and the sample, and which is configured to correct the radiation direction of the ion beam having passed through the focusing lens electrode, and to perform scanning with the corrected ion beam in a direction parallel to a surface of the sample; and
    a deflection control unit which is configured to apply a correction signal to the deflector such that the deflector performs the correction, and to apply a scan signal to the deflector such that the deflector performs the scanning,
    wherein the deflector is configured to perform the correction such that the radiation direction of the ion beam having passed through the focusing lens electrode becomes parallel to an axial line of the emitter, and
    wherein the image acquiring mechanism is configured to acquire an FIM image based on the scan signal and a detection signal of secondary charged particles generated from the sample at incidence of the ion beam, or based on the scan signal and a detection signal of a beam current of the ion beam incident on the sample.

* * * * *